(12) United States Patent
Goodwin et al.

(10) Patent No.: US 6,400,577 B1
(45) Date of Patent: Jun. 4, 2002

(54) INTEGRATED CIRCUIT SOCKET ASSEMBLY HAVING INTEGRAL SHIELDING MEMBERS

(75) Inventors: Jonathan W. Goodwin, Braintree; Chuanlong Yue; Curtis G. Knaub, both of North Attleboro, all of MA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 09/943,596

(22) Filed: Aug. 30, 2001

(51) Int. Cl.$^7$ ................................................. H05K 9/00
(52) U.S. Cl. ........................ 361/816; 361/818; 361/704; 361/709; 361/800; 174/35 R; 174/35 MS; 174/35 GC; 257/717; 257/718; 257/719
(58) Field of Search ................................ 361/816, 818, 361/704, 709, 753, 715, 800; 174/35 R, 35 GC; 439/66, 71, 74, 341; 257/717–719

(56) References Cited

U.S. PATENT DOCUMENTS

| | | | | |
|---|---|---|---|---|
| 5,880,930 A | * | 3/1999 | Wheaton | .................... 361/690 |
| 5,919,050 A | * | 7/1999 | Kehley et al. | ................ 439/71 |
| 6,043,983 A | * | 3/2000 | Taylor et al. | ................ 361/704 |
| 6,061,235 A | * | 5/2000 | Cromwell et al. | .......... 361/690 |
| 6,155,860 A | * | 12/2000 | Lemke et al. | ............... 439/341 |
| 6,198,630 B1 | * | 5/2001 | Cromwell | ................... 361/704 |

* cited by examiner

*Primary Examiner*—Jayprakash N. Gandhi
*Assistant Examiner*—Thanh S. Phan
(74) *Attorney, Agent, or Firm*—Weingarten, Schurgin, Gagnebin & Lebovici LLP

(57) ABSTRACT

An integrated circuit socket assembly including a frame and a contact assembly has EMI shielding integral with the socket frame. In one embodiment, the integrated circuit socket includes a cocket for a Land Grid Array (LGA) or Ball Grid Array (BGA) device. EMI shielding in the form of a conductive shielding member is disposed in opening that extend through side portions one each of the sides of the frame. The conductive shielding members extend slightly below the lower surface of the the frame so as to make contact with cooperative conductive areas on a printed circuit board when the socket assembly is mounted to the printed circuit board in amounting position. The conductive shielding members may extend above the upper surface of the frame so as to contact a conductive heat sink mounted above the socket assembly. In a preferred embodiment, the conductive members comprise resilient conductive shielding members.

14 Claims, 4 Drawing Sheets

INTEGRATED CIRCUIT SOCKET ASSEMBLY HAVING INTEGRAL SHIELDING MEMBERS

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

Sockets are known for integrated circuits that have an array of contacts on the bottom surface of the circuit package. One well-known form of such a socket is employed for retaining a land grid array (LGA) package. A LGA circuit package typically comprises a rectangular housing or body having an array of contacts on the bottom surface of the housing. These contacts are mateable with contacts of an LGA socket.

It is often desirable to provide electromagnetic interference (EMI) shielding for integrated circuits to minimize electromagnetic interference that might affect the electronic performance of the integrated circuit and additionally, to prevent interference with other electronic devices and/or circuits that might emanate from the integrated circuit. Such interference can be deleterious to circuit operation especially in high-speed digital circuits.

The use of EMI shielding for integrated circuit devices is generally know but typically, such has been implemented via shielding gaskets or shielding enclosures which are separate from the integrated circuit socket. For example, in one shielding technique known in the art, metallic conductive members are formed that extend downward from the periphery of a conductive heatsink. The heatsink is disposed over an LGA socket so that the heatsink forms a shield over the top surface of the integrated circuit while the conductive members form a conductive skirt that surrounds the sides of the integrated circuit. Providing shielding in this manner is expensive and generally undesirable in high volume applications. In another shielding system, a conductive O ring is disposed around an LGA socket and between a conductive ground plane on a circuit board and a heat sink mounted over the LGA socket. This technique requires additional assembly steps to deal with multiple parts during the installation of the O ring and is also generally undesirable for high volume applications.

BRIEF SUMMARY OF THE INVENTION

In brief, the present invention provides an integrated circuit socket assembly which has EMI shielding integral with the socket assembly such that no additional shielding elements are required to provide a requisite level of shielding for the integrated circuit retained in the socket assembly.

In one embodiment, the socket assembly is implemented as an LGA socket assembly that includes an array of resilient conductive contacts that are mateable with the contacts of an LGA circuit package. The socket assembly comprises a frame of non-conductive material that supports an insulative sheet that retains an array of resilient conductive contacts in a pattern corresponding to that of the package contacts. The conductive shielding members are formed of resilient conductive material and are disposed and retained in slots within side members of the frame so as to engage a cooperative conductive surface on a circuit board when the socket assembly is mounted to the board. Additionally, the conductive shielding members are configured so as to contact a conductive heatsink mounted above the socket assembly. In this manner a shielded enclosure for the socketed circuit package is provided.

BRIEF DESCRIPTION OF THE SEVERAL VIEWS OF THE DRAWING

The invention will be more fully understood from the following detailed description taken in conjunction with the accompanying drawings of which.

DETAILED DESCRIPTION OF THE INVENTION

Figure 1:
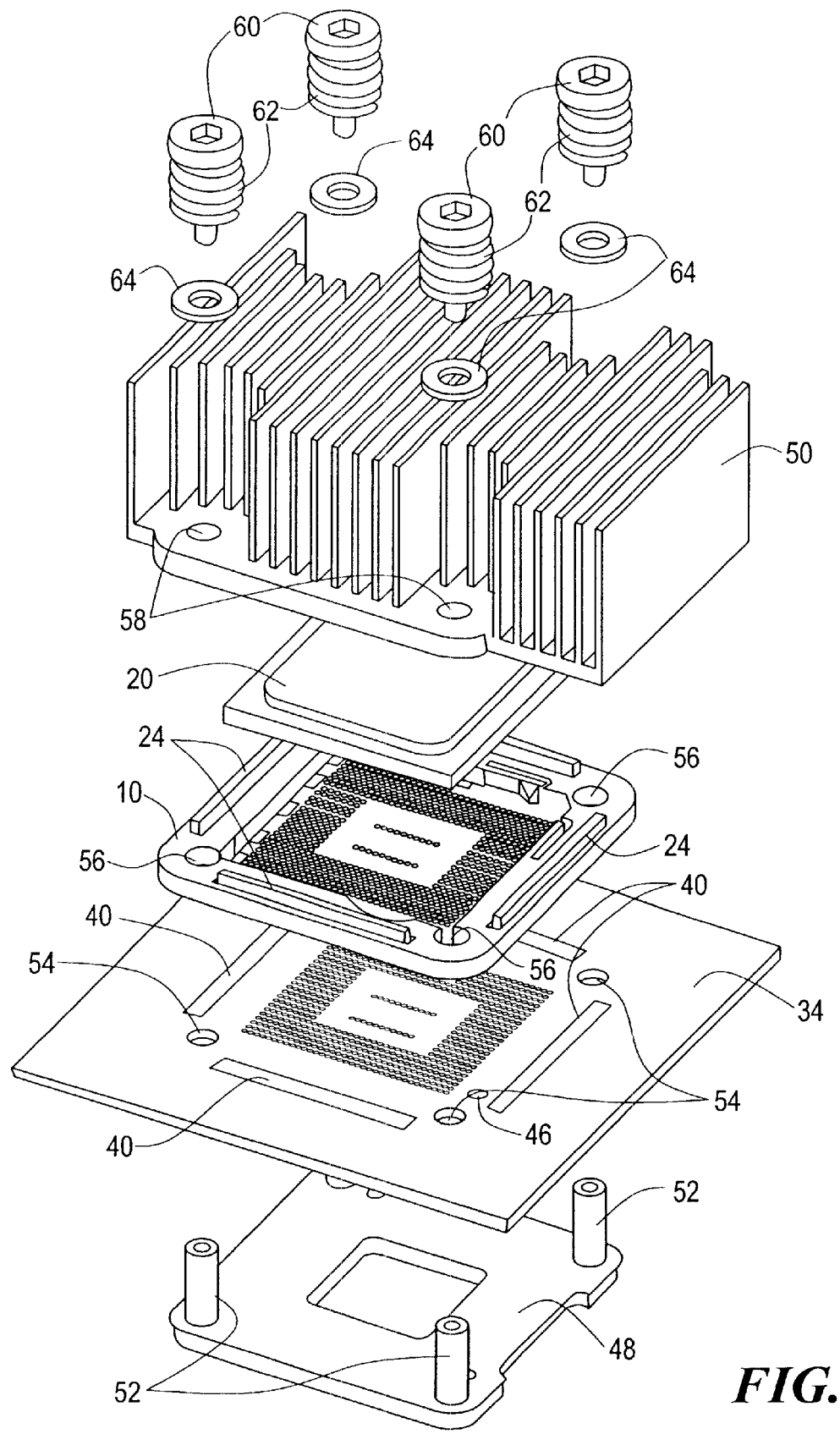
FIG. 1 is an exploded view of an LGA integrated circuit packaging assembly including a socket assembly in accordance with the present invention.
Figure 2:
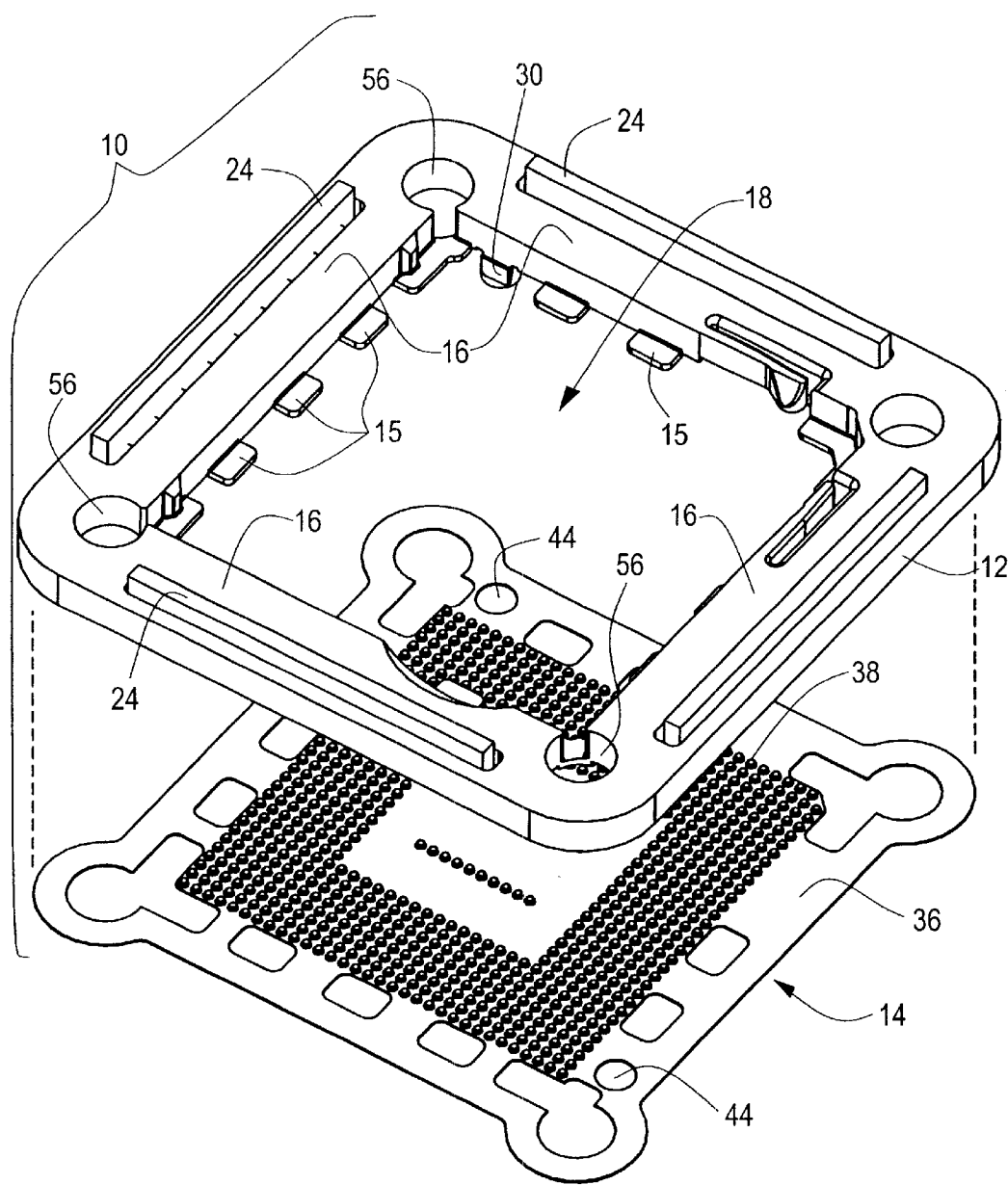
FIG. 2 is a pictorial view of the socket assembly of FIG. 1.
Figure 3A:
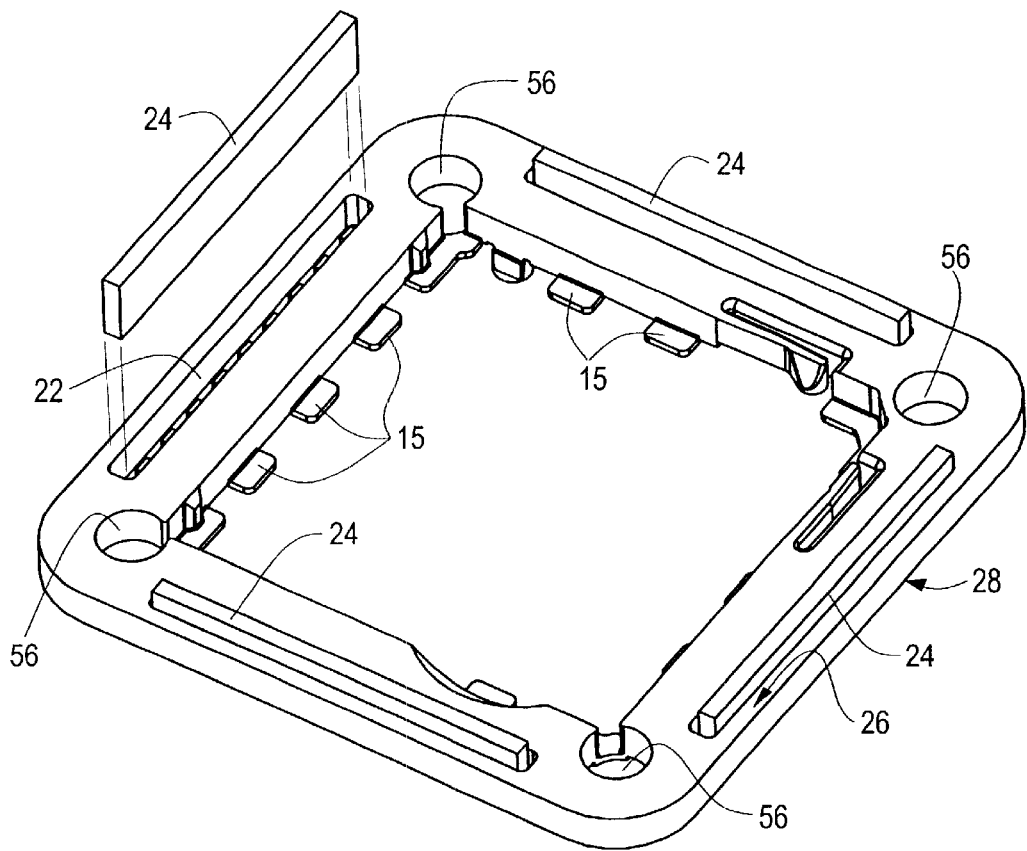
FIG. 3a is a pictorial top view of the frame employed in the socket assembly of FIG. 2.
Figure 3B:
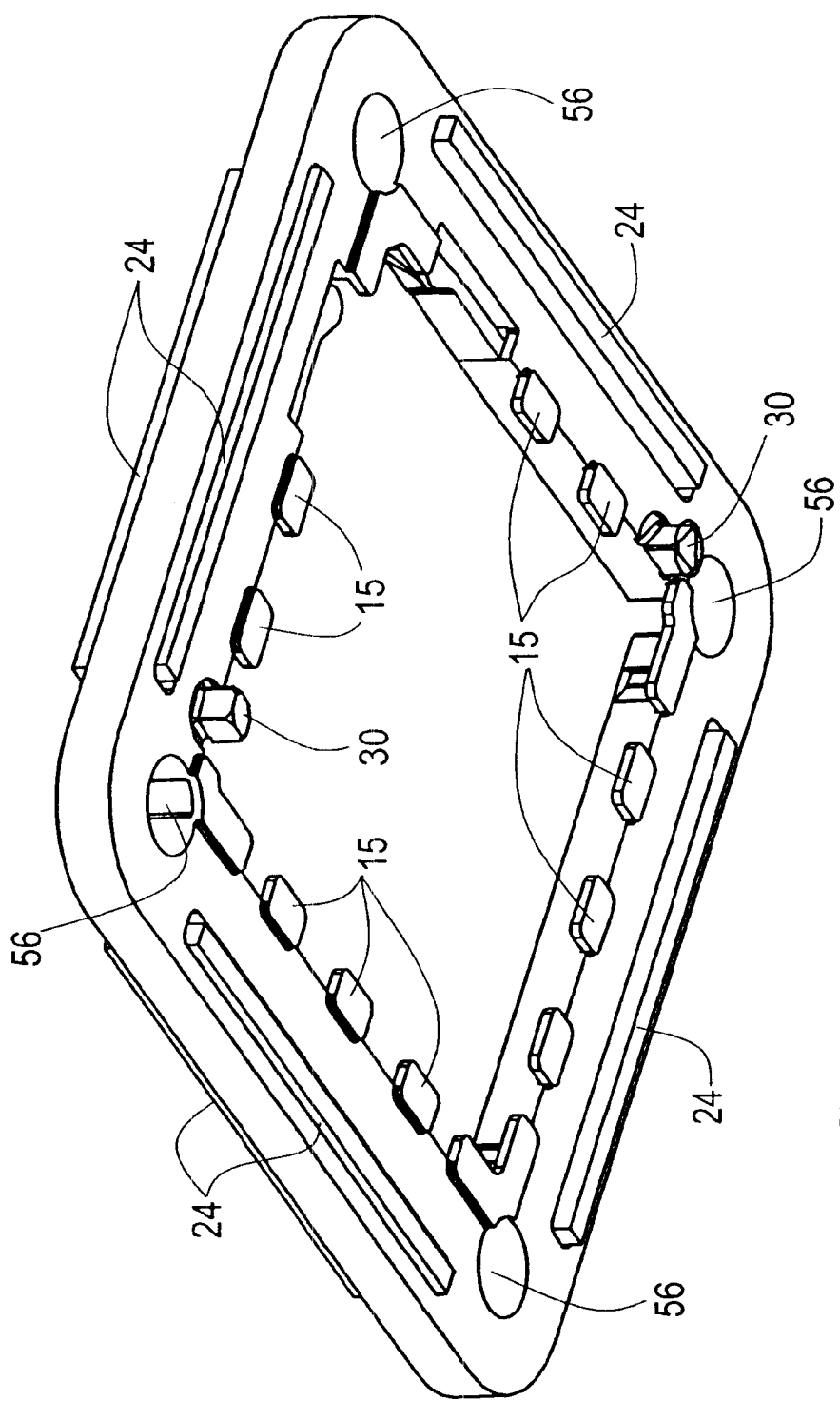
FIG. 3b is a pictorial bottom view of the frame employed in the socket assembly of FIG. 2.

Referring to FIGS. 1–3b, a packaging assembly including a socket assembly for an integrated circuit device such as an LGA device is shown. The packaging assembly provides EMI shielding for an integrated circuit mounted within the socket assembly.

More specifically, the packaging assembly includes a socket assembly 10 that includes a non-conductive frame 12 that is mounted to a contact assembly 14. The frame 12 is generally square or rectangular in shape and has four side members 16 that define a shallow central cavity 18. The frame 12 is preferably formed as an integrally molded plastic part and is sized to accommodate an integrated circuit package 20, such as an LGA package, within the central cavity 18. The integrated circuit package 20 includes a plurality of contacts on one surface thereof that are arranged in a predetermined contact pattern (contact pattern not shown). The frame 12 includes vertical slotted openings 22 extending through the side members 16 of the frame 12. Conductive shielding members 24 are disposed within the slotted openings 22 and retained within the openings 22 via a friction fit. In the illustrated embodiment, the conductive shielding members 24 are formed of a conductive elastic polymer a conductive elastic rubber, a metal or any other suitable conductive material. The conductive shielding members 24 in one embodiment are generally parallelepipeds having rectangular faces. The shielding members 24 are sized so as to extend slightly above the top surface 26 and below the bottom surface 28 of the frame 12 when the resilient conductive shielding members 24 are in an uncompressed state.

The frame 12 includes a set of alignment posts 30 for locating the contact assembly 14 with respect to the frame 12 and for aligning the frame 12 with respect to the printed circuit board 34. The frame 12 also includes abutments 15 that define a mounting surface for the integrated circuit device 20. More specifically, the bottom surface of the integrated circuit device 20 abuts the abutments 15 when the integrated circuit device is mounted within the socket assembly 10.

The contact assembly 14 includes an insulating sheet 36 having an array of resilient conductive columns 38 having upper and lower contact ends. The conductive columns 38 are mounted in respective openings within the insulating sheet 36 as described in U.S. Pat. No. 6,271,482 issued Aug. 7, 2001 and owned by the assignee of the present invention. The conductive columns 38 are arranged in a predetermined contact pattern corresponding to the contact pattern of the integrated circuit package 20 such that the contacts of the integrated circuit package contacts mate with the corresponding conductive columns 38 mounted to the insulating sheet 36 when the integrated circuit package 20 is mounted within the socket assembly 10. In an uncompressed state, the conductive columns 38 extend approximately 0.010 inch above the mounting surface defined by the abutments 15 so the contacts on the bottom surface of the integrated circuit device 20 compressively engage the top ends of the conductive columns 38 when the integrated circuit device is mounted within the socket assembly 10.

The contact assembly 14 is mounted to the underside of the frame 12 using an acrylic adhesive or via any other suitable mounting technique and is aligned with respect to the frame via alignment posts 30 that pass through cooperative alignment holes 44 in the insulating sheet 36.

When mounting the socket assembly 10 to the circuit board 34, the socket assembly 10 is aligned with respect to the circuit board 34 via the alignment posts 30 that extend from the bottom surface of the frame 12. The alignment posts 30 are cooperative with corresponding alignment holes 46 in the circuit board 34 to accurately maintain the socket assembly 10 in position so that the lower ends of the conductive columns 38 engage corresponding contacts on the circuit board 34. When the socket assembly 10 is aligned with respect to the circuit board 34, the conductive shielding members 24 contact conductive areas 40 on the circuit board 34 that are electrically coupled to a ground plane. The lower ends of the conductive columns 38 that engage the corresponding contacts on the circuit board 34 may be coated with a conductive polymer or other material which bonds to the contacts of the circuit board 34. The other contact ends of the conductive columns 38 which engage the contacts on the integrated circuit package 20 do not bond to the integrated circuit package contacts so that the integrated circuit package 20 remains removable from the socket assembly 10.

The packaging assembly for the integrated circuit comprises a sandwich that includes a mounting frame 48, the printed circuit board 34, the socket assembly 10, the integrated circuit package 20, and an electrically conductive heat sink 50. The mounting frame 48 includes upstanding posts 52 that have threaded upper ends to receive cooperative shoulder screws 60. The posts 52 are inserted through corresponding holes 54 in the circuit board 34, through corresponding holes 56 in the frame 12 of the socket assembly 10 and through corresponding holes 58 in the heat sink 50. The shoulder screws 60 each have a surrounding spring 62. The shoulder screws 60 pass through a washer 64 and are screwed into the threads of the posts 52 until the shoulder screw 60 bottoms out on the upper end of the respective post 52. The springs 62 apply a compressive force to the overall assembly to maintain the bottom surface of the heatsink 50 in abutting relation with the upper surface of the integrated circuit package 20, to maintain the contacts of the integrated circuit package 20 in electrical engagement with the upper ends of the conductive columns 38, to maintain the lower ends of the conductive columns 38 in electrical engagement with the corresponding contacts on the circuit board 34 and to maintain the conductive shielding members 24 in electrically conductive abutting relation with the heat sink 50 and corresponding ground areas 40 on the circuit board 34. In the foregoing manner, the conductive shielding members 24 and the heat sink 50 are cooperative to form an effective EMI shield for the integrated circuit package 20.

In an alternative embodiment, the posts 52 are threaded and cooperative cap nuts are employed in place of the shoulder screws 60 to secure the assembly.

It will be appreciated by those of ordinary skill in the art that modification to and variations of the above described socket assembly and packaging assembly may be made without departing from the inventive concepts disclosed herein. Accordingly, the invention should not be viewed as limited except by the scope and spirit of the appended claims.

What is claimed is:

1. A shielded socket for an integrated circuit package comprising:

a frame of insulating material having four side portions with at least one opening extending along at least a portion of the length of the respective side portion and vertically through the respective side portion, said side portions defining a central cavity sized to receive said integrated circuit package;

a contact assembly mounted to said frame, said contact assembly having an array of conductive columns having respective contact ends and an insulative sheet in which the conductive columns are mounted, said array being arranged in a predetermined pattern to mate with corresponding contacts on said integrated circuit package; and a conductive member disposed in said at least one opening of each of said side portions and extending at least partially along the length of the respective side portion;

said socket configured to be mountable to an associated printed circuit board such that each conductive member contacts a conductive area coupled to a ground plane when the socket is disposed in a mounting position on said printed circuit board so as to provide EMI shielding for said integrated circuit package when said package is mounted within said socket.

2. The shielded socket of claim 1 wherein said frame includes first elements for alignment of said contact assembly to said frame and for alignment of said socket assembly to said printed circuit board, and second elements for alignment of said integrated circuit package with respect to said socket assembly.

3. The shielded socket of claim 1 wherein said conductive members comprise resilient conductive shielding members.

4. The shielded socket of claim 1 wherein said conductive members comprise metallic shielding members.

5. The shielded socket of claim 1 further including a conductive cap, wherein said conductive cap is mounted atop said frame and electrically coupled to said conductive members.

6. The shielded socket of claim 5 wherein said conductive cap comprises a heat sink, said heat sink having a lower surface configured to be in abutting relation with said integrated circuit package when said heat sink is mounted atop said socket assembly.

7. The shielded socket of claim 6 wherein said heat sink is mounted in heat conducting relation to said integrated circuit package when said integrated circuit package is mounted within said central cavity of said shielded socket.

8. A reduced EMI packaging assembly comprising:

an integrated circuit device having a plurality of contacts disposed on one surface of said device in a predetermined contact array pattern;

a socket assembly comprising a frame and a contact assembly, said frame of insulating material having four side portions with at least one opening extending along at least a portion of the length of the respective side portion and vertically through the respective side portion, said side portions defining a central cavity sized to receive said integrated circuit device, said contact assembly mounted to said frame, said contact assembly having an array of conductive columns having respective contact ends and an insulative sheet in which the conductive columns are mounted, said array being arranged in said predetermined contact pattern;

a conductive shielding member disposed in said at least one opening in each of said side portions and extending at least partially along the length of the respective side portion; and a printed circuit board having a plurality of conductive areas disposed thereon, wherein said traces are configured to be coupled to ground potential in an operational electronic device;

said integrated circuit device being mounted within said socket assembly and said socket assembly being mounted to said printed circuit board in a socket assembly mounting position with said conductive shielding members in electrically conductive abutting relation with corresponding conductive areas of said circuit board so as to provide EMI shielding of said integrated circuit device.

9. The packaging assembly of claim 8 further including an electrically conductive heat sink mounted to said socket assembly in electrically abutting relation with said conductive shielding members so as to form a shielding enclosure for said integrated circuit device comprising said heat sink and said conductive shielding members.

10. The packaging assembly of claim 9 further including a mounting member disposed on a first side of said printed circuit board, said mounting member having a plurality of upstanding posts extending therefrom and through corresponding holes in said printed circuit board, said socket assembly being mounted on a second side of said printed circuit board and said upstanding posts extending through corresponding holes in said frame of said socket assembly and through corresponding holes in said heat sink, said packaging assembly being retained in assembled relation via fasteners that engage respective upstanding posts.

11. The packaging assembly of claim 8 wherein said frame further includes first elements for alignment of said contact assembly with respect to said frame and for alignment of said socket assembly with respect to said printed circuit board, and second elements for alignment of said integrated circuit package with respect to said socket assembly.

12. The packaging assembly of claim 8 wherein said conductive shielding members comprise resilient conductive shielding members.

13. The packaging assembly of claim 8 wherein said conductive shielding members comprise metallic shielding members.

14. The packaging assembly of claim 8 further including a conductive cap, wherein said conductive cap is mounted above said socket assembly and is electrically coupled to said conductive members.

* * * * *